United States Patent [19]

Bergmann

[11] Patent Number: 4,557,981
[45] Date of Patent: Dec. 10, 1985

[54] ARTICLE COMPRISING A SUBSTRATE HAVING A HARD AND CORROSION-PROOF COATING THEREON

[75] Inventor: Erich Bergmann, Fläsch, Switzerland

[73] Assignee: ETA S.A., Fabriques d'Ebauches, Granges, Switzerland

[21] Appl. No.: 578,637

[22] Filed: Feb. 9, 1984

[30] Foreign Application Priority Data

Feb. 17, 1983 [CH] Switzerland ............................ 879/83

[51] Int. Cl.$^4$ ............................................. C23C 15/00
[52] U.S. Cl. ..................................... 428/627; 428/675; 428/678; 428/679; 428/610; 428/614; 63/21
[58] Field of Search ............... 428/627, 675, 678, 679, 428/610–614; 63/21

[56] References Cited

U.S. PATENT DOCUMENTS 3,857,682 12/1974 White ................................ 428/623
4,284,687 8/1981 Dreyer et al. ..................... 428/627

FOREIGN PATENT DOCUMENTS 507748 6/1976 Australia .
0038294 3/1981 European Pat. Off. .
0074322 8/1982 European Pat. Off. .
2528255 2/1976 Fed. Rep. of Germany ...... 428/627
56-81670 7/1981 Japan ................................. 428/627

OTHER PUBLICATIONS

John A. Thornton, Annual Rev. Materials Science, vol. 7, pp. 239–260, 1977.
Metal Finishing, vol. 74, aout 1976, J. A. Thornton: "Sputter Deposition Onto Plastics", pp. 32–34, 40.
Thin Solid Films, vol. 45, No. 2, 1977, J. A. Thornton, et al.: "Sputtered Austenitic Manganese Steel", pp. 397–406.
Thin Solid Films, vol. 40, 1977, J. A. Thornton, et al.: "Structural and Wear Properties of Sputter-Deposited Laves Intermetallic Alloy", pp. 365–374.
Chemical Abstracts, vol. 81, No. 4, Juillet 29, 1974, p. 179, resume No. 16080j, Columbus, Ohio (US) & Poluch. Pokrytii Vysokotemp. Raspyleniem 1973, 194–209 L. K. Druzhinin et al.: "Manufacture of Coatings and Powders by the High-Temperature Spraying of Metallic and Ceramic Materials in a Controlled Atmosphere".
Stellite Brochure, Produits Resistant a l'Usure et Services, Wear Technology Division, pp. 1–12, Cabot Corporation.
Swiss Search Report.
EPO Search Report.

*Primary Examiner*—Veronica O'Keefe
*Attorney, Agent, or Firm*—Pollock, Vande Sande & Priddy

[57] ABSTRACT

An article comprising a substrate having a hard and corrosion-proof coating thereon. The coating includes a thin metallic layer having an ultrafine distribution of hard materials and a particular compact morphology.

12 Claims, 6 Drawing Figures

ARTICLE COMPRISING A SUBSTRATE HAVING A HARD AND CORROSION-PROOF COATING THEREON

DESCRIPTION

TECHNICAL FIELD

The present invention pertains to articles which comprise a substrate having a hard and corrosion-proof coating, and it relates especially to articles useful as jewelry items, such as watch bands or casings.

BACKGROUND ART

It is known, especially in the area of watch casings, that a casing is coated with a hard coating, which shields it from corrosion and scratching, or from wear and tear due to contact of the casing with external objects, or the clothes of the watch wearer. For instance, European patent application No. 0 038 294 and Swiss patent application No. 631040G pertain to hard titanium nitride-based coatings, which display, in addition to their hardness, the advantage of displaying a color very close to that of gold.

However, even though the coating as obtained displays very good resistance to wear and tear, their withstanding of shocks, for instance against hard surfaces, is not entirely satisfactory. Indeed, because the coatings which are applied are relatively thin, about several dozen microns, the hardness of the coated part is roughly that of the substrate, which can be brass or steel, and if a dent in the substrate occurs, such can lead to deterioration of the hard coating, and of the appearance of the part.

In order to remedy the above disadvantage, a substrate that is made from a hard material, can be employed. However, the cost price of such an item and its tooling prior to coating become prohibitive, thereby detracting from its potential marketability.

SUMMARY OF THE INVENTION

Thus, the main purpose of this invention is to provide a coated part or article which includes a substrate that is made of a classical substance, such as brass or steel, and which is coated with a thin layer, that gives the unit a hardness which is greatly superior to the hardness that the material displays of which the coating layer is formed, when this hardness is measured on a mass of the coating material alone.

Indeed, it is surprising that by creating a thin metallic layer from a given material, where we achieve an ultrafine distribution of hard materials and a characteristic morphology in accordance with the present invention, the hardness of that layer can be double that of the considered massive material, while displaying excellent optical qualitites.

BEST AND VARIOUS MODES OF CARRYING OUT THE INVENTION

Figure 1:
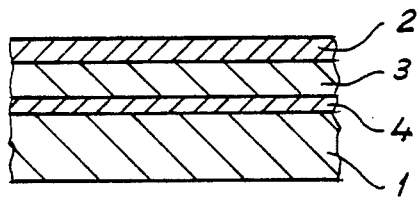
FIG. 1 is a schematic sectional view of a part or article according to the invention.

In FIG. 1 a section of an article is schematically depicted which includes a substrate 1, and a hard coating which comprises an outer decorative layer 2 which resists wear and tear and corrosion and a metallic layer 3, of great hardness, which ensures for the entire article the required resistance against damage. The substrate 1 can also be made of any material that is easy to tool, such as brass or steel. In the event that brass is used, an intermediate layer 4 which forms a diffusion barrier is placed between the substrate 1 and the metallic layer 3, so as to prevent zinc in the brass from migrating to the outer layers, which would tarnish the appearance of the article. Preferably intermediate layer 4 is a molybdenum layer which measures between 0.1 and 0.5 $\mu$m in thickness. The outer layer 2 can be made of any material which resists wear and tear, but the use of a layer of titanium nitride having a thickness of 1 to 2 $\mu$m is especially recommended for jewelry items.

Metallic layer 3 has a thickness of 2 to 100 $\mu$m and preferably between 5 and 15 $\mu$m. Layer 3 is distinguished by an ultrafine distribution of hard materials, and can be made from any metallic alloy that can be hardened through scattering of hard materials, such as nickel-boron alloys, or rapid martensitic steels. Preferably a cobalt-chromium-tungsten alloy such as that available under the trade designation, Stellite, that is to say, an alloy with a high cobalt concentration, of which the composition is between 2 and 3% of carbon, 40 to 55% of cobalt, 25 to 35% of chromium, 10 to 20% of tungsten, 15% molybdenum, and, 4% total of iron, nickel and titanium is used.

Experience has shown that when those alloys are deposited by methods of the plasma assisted deposition kind, such as cathodic sputtering which is carried out with a flat magnetron or a ion beam, the layer that is made from a Stellite target includes a stainless alloy matrix, in which ultrafine distribution of chromium or tungsten carbide occurs which ensures a very high degree of hardness to the article. By ultrafine distribution is meant that the fragments of hard materials which are distributed in the matrix display a size that is smaller than 100 Å and preferably lower than 50 Å. The hardness of the layer that is obtained equals about 1200 to 1500 HV 10 p (hardness vickers for a load of 10 pounds), whereas the hardness of the massive Stellite only equals 750 HV 10 p. The depositing process, which is known of itself, destroys the plate or dendritic structure of the chromium carbide, which is usually the cause for frailness in stainless alloys.

Figure 2:
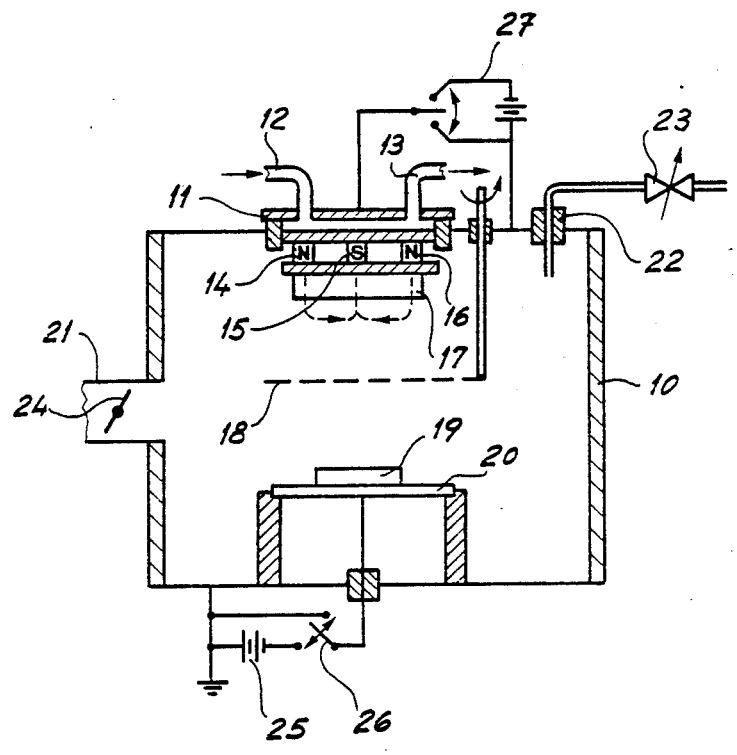
FIG. 2 is a schematic view of an apparatus suitable for achieving the coating of the article in FIG. 1.

In FIG. 2 there is depicted schematically apparatus which makes it possible to obtain a metallic layer with an ultrafine distribution of hard materials according to the present invention. Employed is a vacuum chamber 10, in the upper section of which is a flat magnetron 11. The flat magnetron includes a cathode which is cooled by a water cooling circuit 12, 13 and permanent magnets 14 through 16 which create a magnetic field designed to confine a plasma in the immediate vicinity of a target 17 that is placed on the cathode 11. A removable screen 18 can be inserted between the target 17 and the substrate 19 designed to be coated, which is placed on a substrate electrode 20. The chamber 10 can be evacuated with a turbo-molecular pump (not shown) connected to an opening 21. A pressure of argon or of another inert gas can be established by means of a nozzle 22, equipped with a precision valve 23, and from the choke valve 24 mounted inside the opening. Electrically, a polarity select circuit 25 which is equipped with a switch 26 makes it possible to raise the substrate 19 to a negative potential in relation to that of the chamber structure when it is desired to clean it prior to depositing. Furthermore, a polarity select circuit 27 makes it possible to raise target 17 to a negative potential of about several hundred volts.

Figure 6:
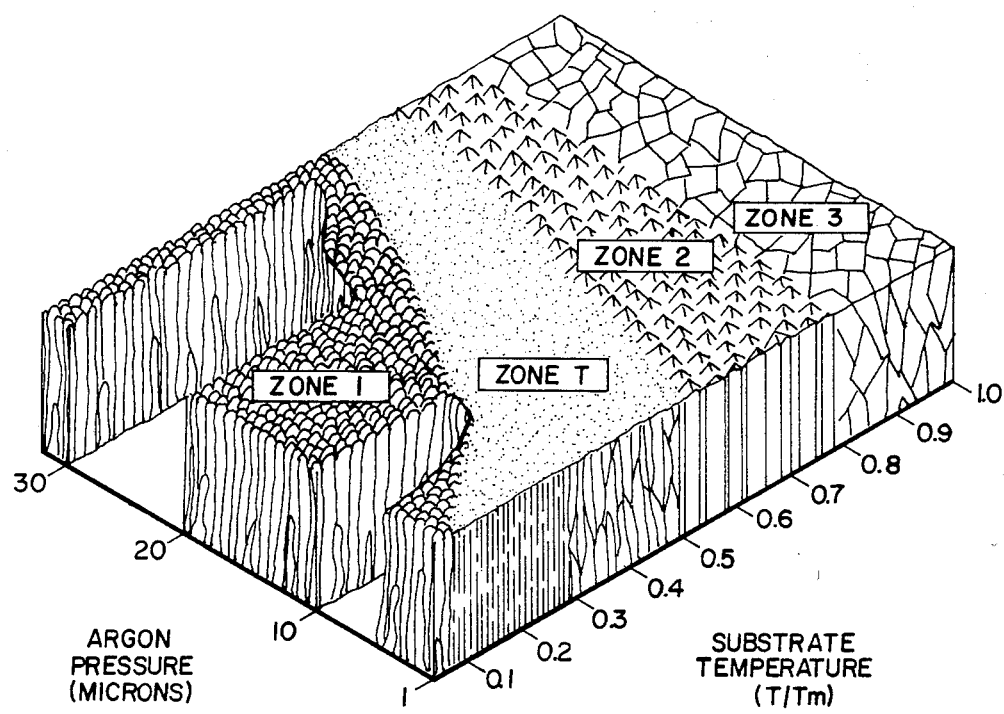
FIG. 6 is a diagram of sputtered metal coatings as published in an article by J. A. Thornton referenced below.

In order to achieve a layer which displays an ultrafine distribution of hard materials according to the present invention, for instance on a steel substrate 19, the procedure is as follows. First of all, the substrate is placed on the substrate electrode 20, after having been polished. A target 17, which is comprised for instance of a sintered or vacuum cast Stellite plate, is affixed to the flat magnetron cathode 11. Then the chamber 10 is evacuated, and a pressure of argon is established there. The substrate is subjected to ion cleaning. Then, the removable screen 18 is removed and polarization is applied to the target 17 whereby material is ejected from the target by ion bombardment and projected onto the substrate 19. In view of the pressure of argon, the depositing speed, of about 0.1 to 10 microns per minute, on which the substrate temperature depends, is determined so that those two last parameters define a point which is included in the zone known as T in the diagram submitted by J. A. Thornton as shown in FIG. 6 and previously published at Ann. Rev. Mater. Sci. 1977.7:239-260. In the diagram of FIG. 6, T is the substrate temperature and Tm is the melting point of the coating material. In that zone known as T in the Thornton diagram, the deposits display a regular and compact structure, which leads to minimal surface roughness. With respect to a Stellite layer deposit, operating conditions are as follows: substrate polarition voltage: 80 V; magnetron cathode polarition voltage: 420 V; argon pressure: 0.8 m Torr. Preferably, the target which is used in the last instance is a Stellite plate obtained through vacuum casting, according to a conventional method.

The point is using Stellite to achieve the layer for ultrafine distribution of hard materials is that it displays very high hardness in the shape of thin layers, of about 1500 HV, and that zone T for that alloy is especially large, which makes operating conditions less critical.

Other alloys might be used, if they are characterized by a distribution of hard materials in a matrix, especially specific nickel-chromium, nickel-boron alloys, or martensitic steels with hardening through precipitation.

After the deposit of the ultrafine hard material distribution layer, it can be coated with a decorative layer made of TiN for instance, according to a known process.

Figure 3:
FIGS. 3 and 4 are micrographs of hard layers according to the invention.

Micrography in FIG. 3 shows through a 800× enlargement, an oblique section of a brass substrate which is coated with a Stellite layer of about 5 μm in thickness that is deposited as stated above. This layer makes it possible to obtain superficial hardness of $X_5 = 1736$ HV 10 p, whereas substrate hardness is only $X_2 = 132$ HV 10 p. The various microdurometer imprints indicate that layer hardness increases as the distance from the interface increases in the way shown in the following table:

| Imprint (from left to right) | Real distance in relation to the interface (μm) | Hardness (HV 10 p) |
| --- | --- | --- |
| 1 | 1.41 | 515 |
| 2 | 2.38 | 804 |
| 3 | 3.13 | 1251 |
| 4 | 3.69 | 1355 |

FIG. 3 indicates that with the microscope enlargement, the Stellite layer seems perfectly homogeneous, the size of the scattered hard material fragments being lower than 100 Å. On the other hand, a massive Stellite alloy which is observed at the solidified state after being cast with the same enlargement discloses a structure of sharply separated phases, which leads to a less sound chemical resistance as a result of electro-chemical reactions with attack grain joints.

Figure 4:
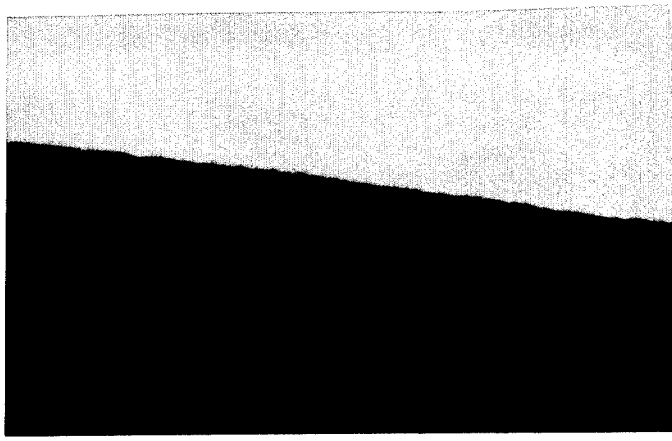

FIG. 4 is a photograph of a break in a coated substrate, which is observed under an electron microscope enlarged at 7000×. This photograph indicates regular and compact morphology, the grain boundaries not being visible. This structure is typical of the T zone in the Thornton diagram, and it leads to coatings with a perfect appearance as a result of minimal surface roughness.

Figure 5:
FIG. 5 is a view that is analogous to that of FIG. 4 of a layer which does not display the characteristics of the invention.

As a comparison, FIG. 5 is a view that is analogous to that of FIG. 4 of a metallic layer which does not display the T zone structure in the Thornton diagram. This structure, which is characteristic of zone 1 in the same diagram, is distinguished by sharply separated columns; distributed in a non-compact fashion, and generating a relief at the surface which impedes highly the esthetics of the coated part.

Even though it was described in conjunction with some of its particular implementation modes, this invention is capable of modifications and variations which will be acknowledged by the one skilled in the art.

What is claimed is:

1. An article comprising a metallic substrate and a metallic coating applied to said substrate by plasma assisted deposition of an alloy composition containing 2%–3% carbon, 40%–55% cobalt, 25%–35% chromium and 10%–20% tungsten, said coating having ultrafine fragments of at least one of chromium carbide and tungsten carbide distributed in an alloy matrix and a compact structure provided by carrying out said plasma assisted deposition at an inert gas pressure and a substrate temperature defined by a point in zone T of FIG. 6.

2. An article according to claim 1, wherein the size of said ultrafine fragments is smaller than 100 Å.

3. An article according to claim 2, wherein said size is smaller than 50 Å.

4. An article according to claim 1 wherein said ultrafine material coating has a thickness ranging from 2 to 100 μm.

5. An article according to claim 4, wherein said thickness ranges from 5 to 15 μm.

6. An article according to claim 1, wherein said ultrafine material coating is a Stellite layer.

7. An article according to claim 1, wherein said ultrafine material coating is coated with a decorative layer which is resistant against wear and tear.

8. An article according to claim 7, wherein said decorative layer is a titanium nitride layer.

9. An article according to claim 1, which includes a brass substrate, and wherein an intermediate layer which forms a diffusion barrier is placed between said brass substrate and said ultrafine material coating.

10. An article according to claim 9, wherein said intermediate layer is a molybdenum layer.

11. An article according to claim 10 wherein, the thickness of the intermediate layer is between 0.1 and 0.5 μm.

12. An article according to claim 1, wherein said article is an item of jewelry.

* * * * *